(12) United States Patent
Raddant

(10) Patent No.: US 6,771,057 B1
(45) Date of Patent: Aug. 3, 2004

(54) CIRCUIT ARRANGEMENT AND METHOD FOR VERIFYING A SWITCHING DIVERSITY SYSTEM

(75) Inventor: Hans-Joachim Raddant, Berlin (DE)

(73) Assignee: Robert Bosch GmbH, Stuttgart (DE)

( * ) Notice: Subject to any disclaimer, the term of this patent is extended or adjusted under 35 U.S.C. 154(b) by 39 days.

(21) Appl. No.: 10/030,400

(22) PCT Filed: Jun. 30, 2000

(86) PCT No.: PCT/DE00/02139

§ 371 (c)(1),
(2), (4) Date: May 9, 2002

(87) PCT Pub. No.: WO01/04649

PCT Pub. Date: Jan. 18, 2001

(30) Foreign Application Priority Data

Jul. 7, 1999  (DE) .......................................... 199 31 252

(51) Int. Cl.[7] .......................... G01R 13/20; H04B 17/00
(52) U.S. Cl. ................................. 324/76.26; 455/226.1
(58) Field of Search ............................. 324/682, 76.26; 455/226.1, 226.4, 423, 131

(56) References Cited

U.S. PATENT DOCUMENTS 6,011,962 A * 1/2000 Lindenmeier et al. ... 455/226.1

FOREIGN PATENT DOCUMENTS

| DE | 44 03 612 | 8/1995 |
|----|-----------|--------|
| DE | 195 13 872 | 10/1996 |
| DE | 299 11 541 | 9/1999 |
| EP | 0 201 977 | 11/1986 |
| EP | 0 806 849 | 11/1997 |
| EP | 0 816 859 | 1/1998 |
| EP | 0 977 044 | 2/2000 |
| JP | 4-223623 | 8/1992 |

* cited by examiner

Primary Examiner—Albert Decady
Assistant Examiner—James Kerveros
(74) Attorney, Agent, or Firm—Kenyon & Kenyon

(57) ABSTRACT

In a circuit arrangement and method for testing a radio receiving system, the circuit arrangement includes multiple antennas, an antenna selector switch for the antennas, a receiver, and a diversity processor that controls the antenna selector switch. A diagnostic processor has an output terminal connected to a control input of the diversity processor, which provides at its output terminal, a signal that prevents the diversity processor from performing any further switching operations.

14 Claims, 4 Drawing Sheets

CIRCUIT ARRANGEMENT AND METHOD FOR VERIFYING A SWITCHING DIVERSITY SYSTEM

FIELD OF THE INVENTION

The present invention relates to a circuit arrangement and a method for testing a diversity switching system.

BACKGROUND INFORMATION

Diversity antenna switching systems are described, for example, in European Published Patent Application No. 0 201 977. The system is essentially a single component having antenna switches and a TEA6101 diversity processor with a TDA1596 IF demodulator, both from Philips. The diversity processor detects receiving disturbances by evaluating an IF signal supplied from the radio, subsequently using the antenna switch to switch over to another antenna, the signal quality of which, in turn, is tested, etc.

This system does not make it possible to easily activate specific antennas for testing, i.e., to connect them to the radio input terminal.

A circuit arrangement that achieves this object is described in German Published Patent Application No. 195 13 872. The following is a description of this circuit arrangement, with reference to FIG. 1. Switching between (for example) four antennas 1, 2, 3 and 4 is accomplished by providing an antenna switch 5, which is controlled by a diversity processor 6. Control signals which are generated by a demodulator 10, and which demodulator 10 derives from the IF signal provided by a receiver (radio) 8 having one or more speakers 9, are present at diversity processor 6.

A converter 51, which is controlled by a control unit, e.g., radio 8, is provided to continuously activate specific antennas. To do this, the control unit generates a digital signal that is transmitted to converter 51, for example, via the antenna cable with separating filter 52, or via the IF line used to control the diversity system. Converter 51 uses electronic switches to select one of, for example, four antennas 1, 2, 3 or 4. However, because diversity processor 6 is not deactivated during testing of the selected antenna, its switching pulses may interfere with the incoming signal.

The procedure described in German Published Patent Application No. 195 13 872 has the advantage that it is relatively easy to implement. Nevertheless, it has the disadvantage that it can test only the function of the antennas, but not the function of the diversity processor itself, and the diversity processor remains in operation while the function of an antenna is being tested.

The express reference made to the above-mentioned publications and to the product description of the above-mentioned circuits also applies to all details and technical objects not described in greater detail here.

SUMMARY

It is an object of the present invention to provide a circuit arrangement and a method for testing a diversity switching system that may be used to test not only the function of the antennas, but also that of the diversity processor itself.

In particular, the circuit arrangement according to the present invention prevents the processor from generating, during diagnosis, switching signals that interfere with the function test.

According to the present invention, a diagnostic processor is provided, which has an output terminal connected to a control input of the diversity processor and which provides, at its output terminal, a signal that prevents the diversity processor from performing any further switching operations.

In particular, use may be made of a characteristic of conventional diversity processors, such as the Philips TEA6101 circuit. This diversity processor may, for example, interrupt switching to another antenna when a stop signal is supplied to its control input.

The diagnostic processor provided according to the present invention generates the stop signal at the exact moment when it determines that the selected antenna has been activated by the diversity processor. Diagnosis is not accomplished by using an additional control unit for the antenna switch, according to the present invention, but rather the diversity processor is suitably controlled so that it continuously activates the selected antenna independently of the antenna signal at the moment.

For clarity, it should be noted that the use of the term "processor" does not imply that this circuit needs to be a microprocessor or microcontroller. "Hard-wired" circuits may also be used instead of processors of this type.

The circuit arrangement according to the present invention may be used, for example, to perform diagnosis as follows:

1. A frequency at which a relatively weak signal is received is first set at the radio. This is necessary because the diversity processor switches to the antenna only within the receiving level range at which noise may be heard in the speaker.
2. The number of the antenna to be set is entered at the radio either subsequently or beforehand. The radio transmits this value to the diagnostic processor.
3. Existing receiving signal fluctuations, or fluctuations that are produced, for example, by touching the antenna, cause the diversity processor to switch to another antenna. If the diagnostic processor determines that the desired antenna is set using a comparator, for example it sets the stop signal for the diversity processor. The achievement of this state is transmitted back to the radio and displayed there.
4. Switching to another antenna is an indication that the diversity processor is in proper working order. The antenna itself may then be tested, for example, by performing an audio test.

If a more thorough test of the system is necessary, for example for final inspection during manufacturing, conventional test signals may be used to test both the diversity switching threshold and the antenna function.

The directional characteristics of the individual antennas may also be tested by disconnecting the antenna cable from the radio input and supplying the antenna output signal to a measuring receiver.

According to a further example embodiment, it is possible to use special switching actions to cause the system to switch to the next antenna during diagnosis. This may be accomplished, for example, by briefly deactivating all antennas and thereby triggering switchover by the diversity processor. This action is most easily performed directly at the antenna switch at the concentration point of the switching diodes.

It is also possible to use the demodulator level signal to evaluate the antenna receiving level more precisely. In the range relevant for diversity operation, the magnitude of this signal is largely proportional to the receiving level and may therefore be compared to a reference signal during the test.

According to a further example embodiment, a test unit produced specifically for the intended purpose may be used instead of the radio as the control unit for the diagnostic processor.

Without limiting its scope and nature, the present invention is described below, by way of example, on the basis of embodiments with reference to the drawing, to which express reference is made for the purpose of describing all details according to the present invention that are not explained in greater detail in the text.

DETAILED DESCRIPTION

In the Figures, the same reference numbers always refer to the same parts, making it unnecessary to introduce these parts repeatedly in the explanation of further figures.

Figure 1:
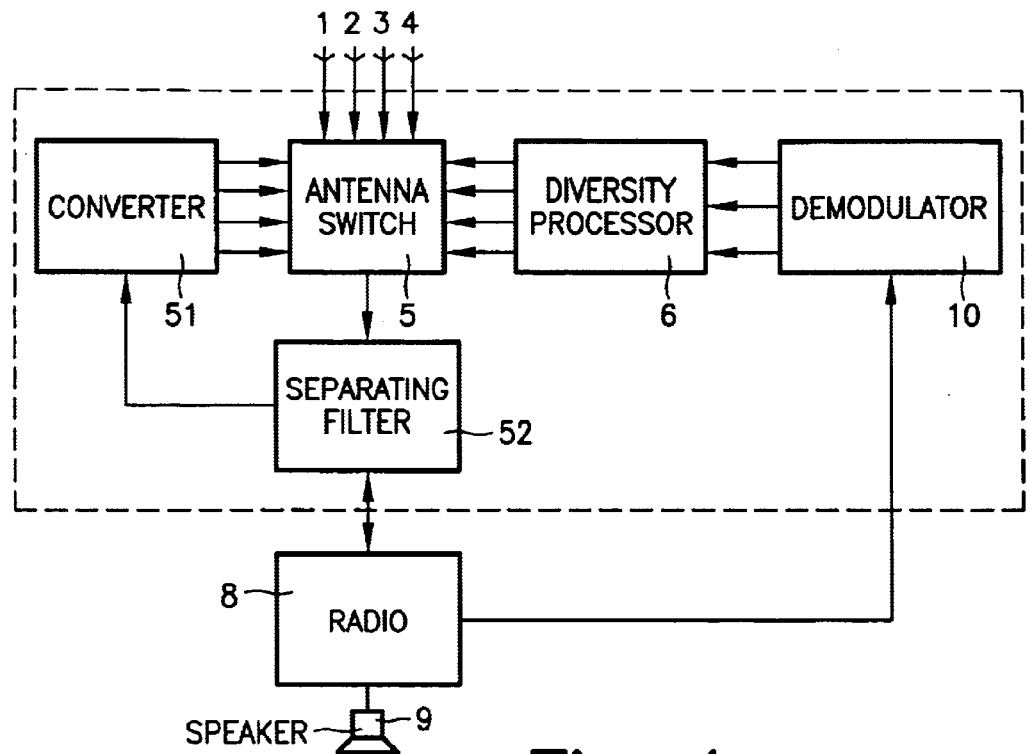
FIG. 1 is a schematic view of a four-antenna diversity system with diagnostic function according to the related art.
Figure 2:
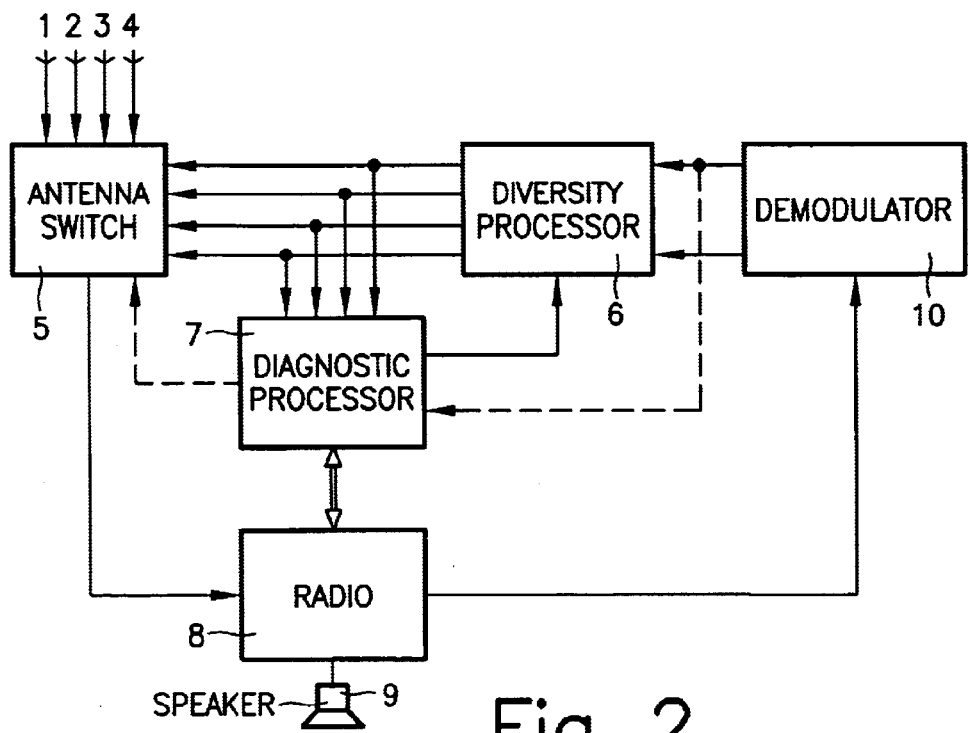
FIG. 2 is a schematic view of an example embodiment of a four-antenna diversity system according to the present invention, having a diagnostic function.

FIG. 2 is a block diagram of an example embodiment of an antenna diversity system having diagnostic function. Four antennas 1 through 4 are connected to an antenna switch 5, which is controlled by a diversity processor 6 and which "switches" the signal of a particular antenna to its output terminal according to the control function. The output signal of antenna switch 5 present at this output terminal (RF signal) is supplied to a radio 8 having at least one speaker 9, which may be used, among other things, to perform an acoustic evaluation.

According to the present invention, a diagnostic processor 7 is provided, the function of which is described below.

Diagnostic processor 7 has input terminals for the four switching lines (in the example embodiment illustrated) for antenna switch 5, one input/output terminal for the digital test signals and one further (optional) input terminal, the function of which is explained below.

The IF signal generated by receiver 8 is supplied to a demodulator 10 over a coaxial cable. Demodulator 10 internally generates, from the IF signal, the level and audio signals, which are sent to diversity processor 6. The level signal, which is also supplied to the other input terminal of diagnostic processor 7, is a DC signal proportional to the IF signal level and enables the receiving level to be evaluated. The audio signal is the modulation content of the radio signal.

Diagnostic processor 7 may also have an output terminal at which is present a signal that may be used to deactivate all antennas.

The operation of diagnostic processor 7 provided according to the present invention is explained in greater detail below with reference to FIGS. 3a to 3d. The same reference numbers refer to the same parts as in FIG. 2 and do not need to be described again.

Figure 3A:
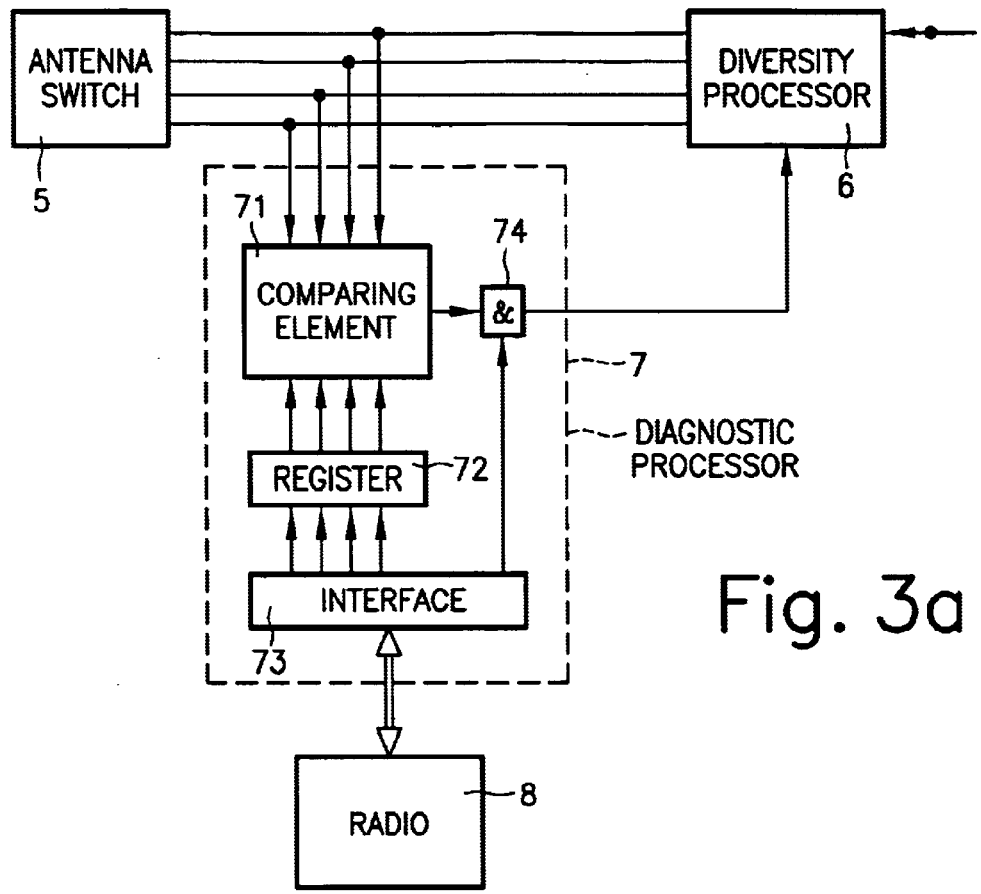
FIG. 3a is a schematic view of a first example embodiment of a diagnostic processor according to the present invention.

FIG. 3a illustrates a first example embodiment of diagnostic processor 7:

The four antenna switching lines (in the example embodiment illustrated) are routed to a comparing element 71. The comparison input terminals of comparing element 71 are connected to a register 72 which stores the number of antenna 1, 2, 3 or 4 to be set for the diagnosis. The number of the antenna is transmitted from radio 8 to comparison input terminals of register 72 via an interface 73. Interface 73 also provides a diagnosis enabling signal, which, together with the output signal of comparing element 71, is present at an AND element 74 in the form of an input signal, the output signal of which is present, in the form of a stop signal, at the control input terminal of diversity processor 6.

Figure 3B:
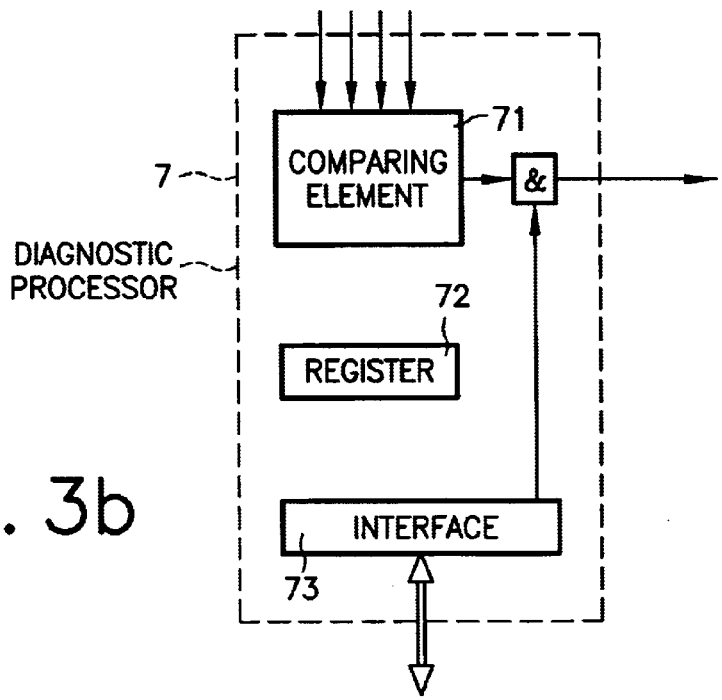
FIG. 3b is a schematic view of a second example embodiment of a diagnostic processor having the ability to deactivate all antennas simultaneously.

FIG. 3b illustrates a modification of the example embodiment illustrated in FIG. 3a, in which interface 73 has an output terminal at which a signal is present which may be used to deactivate all antennas 1 . . . 4. This feature, which may be used when switching to the next antenna, must not or may not be triggered by a poor-quality incoming signal, but rather exclusively by the control unit at a specific point in time.

Figure 3C:
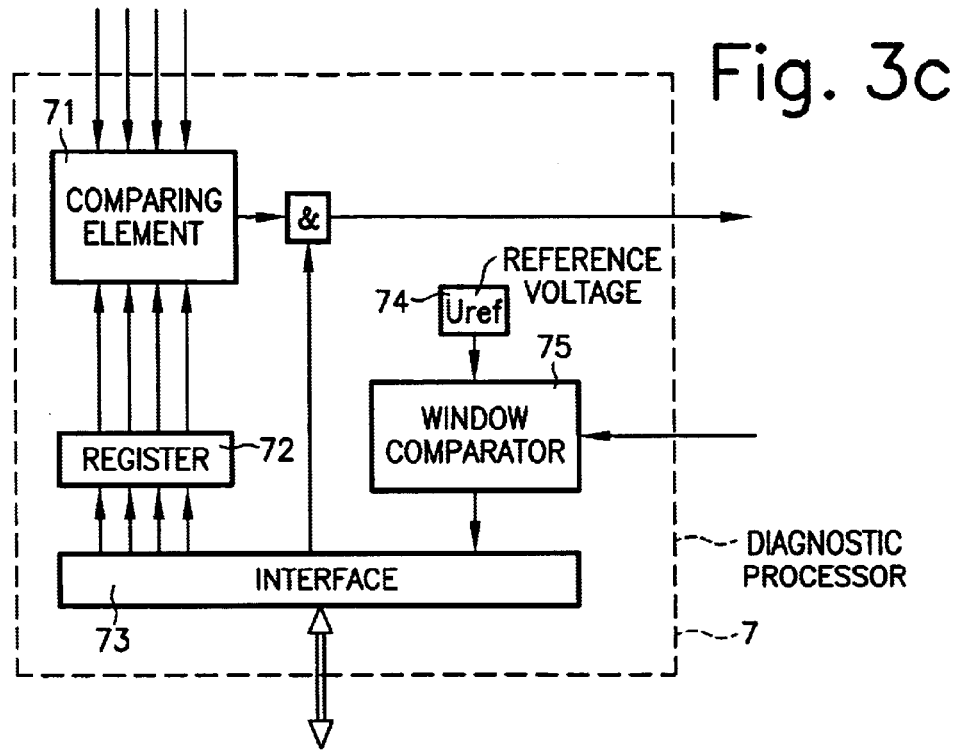
FIG. 3c is a schematic view of a third example embodiment of a diagnostic processor having the ability to evaluated the IF signal level.

According to the example embodiment illustrated in FIG. 3c, not only the test signals generated by radio 8, but also the output signal of a window comparator 75, which compares the level signal to a reference voltage $U_{ref}$, is present at the interface. This characteristic may be used to test the diversity system in the automobile manufacturer's facilities during vehicle production, using defined frequency-modulated RF test signals.

Figure 3D:
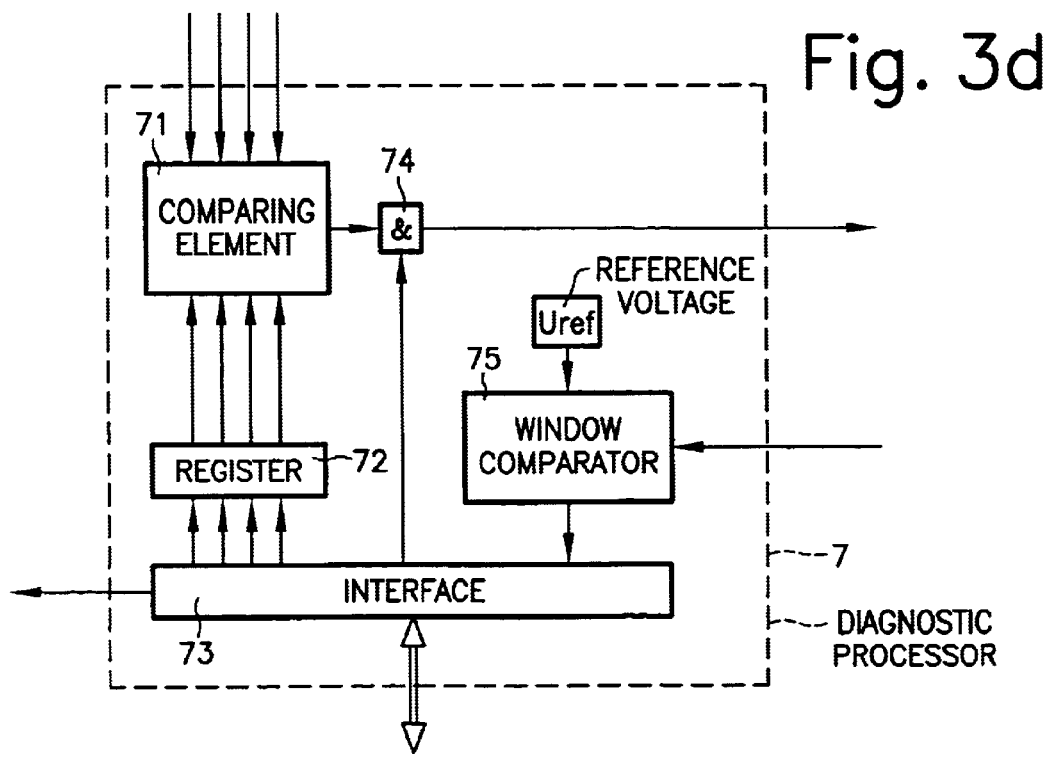
FIG. 3d is a schematic view of a further example embodiment of the diagnostic processor with the ability to deactivate all antennas simultaneously and to evaluate the IF signal level.

FIG. 3d illustrates an example embodiment that has the same characteristics as the example embodiments illustrated in FIGS. 3b and 3c.

It is possible to extend the illustrated circuit to more or fewer than four antennas at any time.

Figure 4:
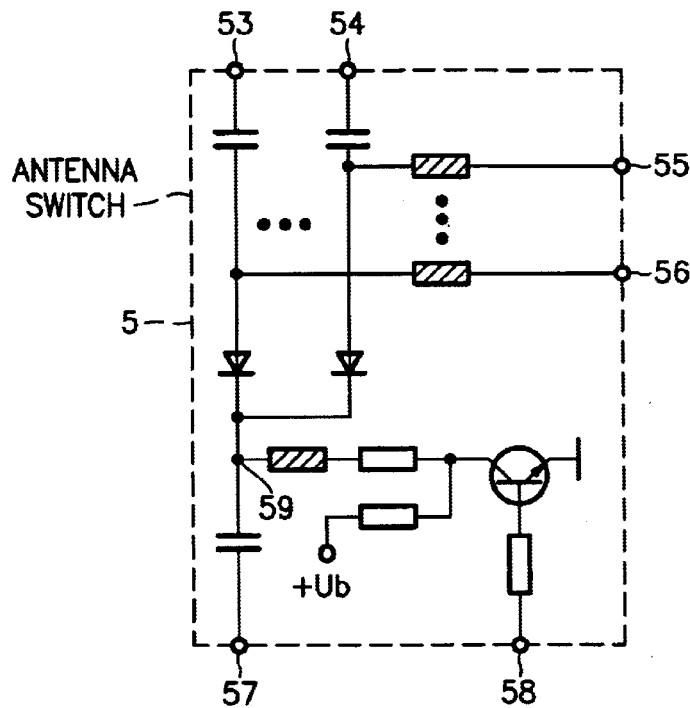
FIG. 4 is a schematic view of an example embodiment of an antenna switch with the ability to deactivate all antennas simultaneously.

FIG. 4 illustrates an example embodiment of an antenna switch 5, which enables all antennas to be deactivated simultaneously. Without limiting the overall configuration, illustrated antenna switch 5 has two inputs 53 and 54 that are connected to a radio output terminal 57 as a function of switching signals present at terminals 55 and 56. Reference number 58 identifies a deactivation input terminal. When a control signal with zero potential is present at terminal 58, circuit point 59 becomes connected to plus voltage +Ub due to the deactivated transistor, so that the switching diodes may no longer conduct current, and a signal is no longer present at terminal 57. This arrangement makes it possible to deactivate all antennas with a single signal.

Figure 5:
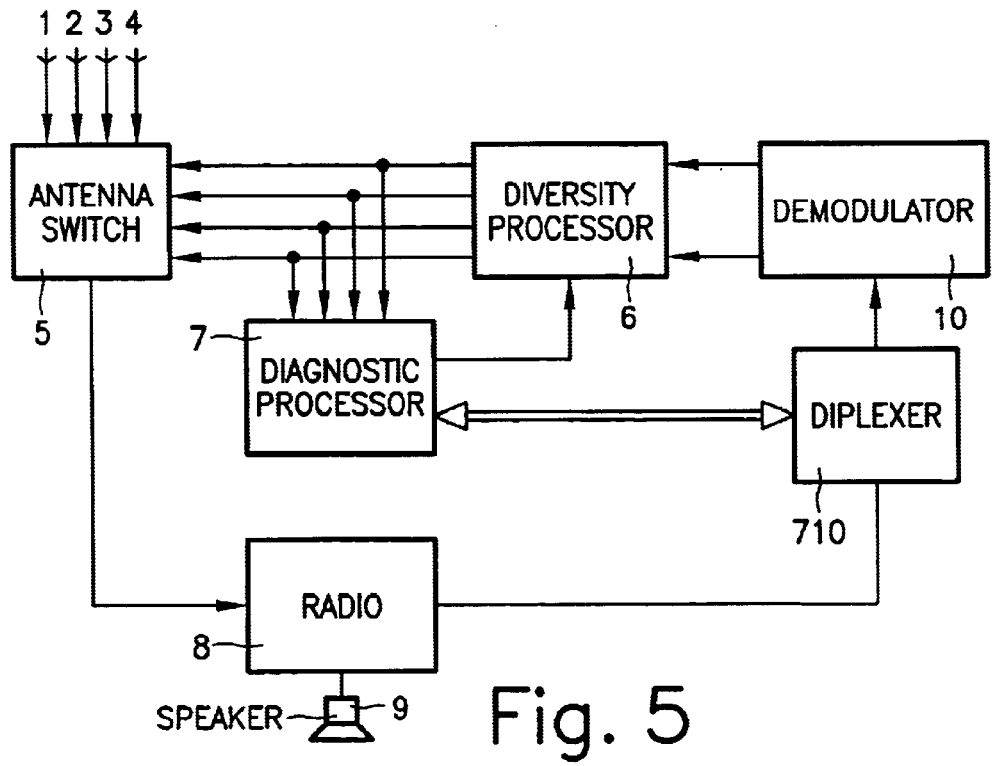
FIG. 5 is a schematic view of a four-antenna diversity system with diagnostic function and transmission of the test signals over the IF line.

FIG. 5 illustrates a modification of the example embodiment illustrated in FIG. 2, in which the test signals are routed via the IF cable to simplify the wiring. This arrangement enables the two diplexers on,,the radio and processor sides, of which only diplexer 710 on the processor side is illustrated in FIG. 5, to couple in and out. The diplexer on the radio side is not illustrated because it is located inside the radio. It is not practical to use the RF antenna cable for this purpose because the latter may need to be removed from the radio, for example, to measure the antenna directional diagrams. The antenna cable is then connected to a measuring receiver. If it is still necessary to control the antenna or activate a particular antenna under these circumstances, the control signals may be transmitted from the radio to the diversity circuit over a cable other than the RF signal cable.

What is claimed is:

1. A circuit arrangement for testing a radio receiving system, comprising:

multiple antennas;

an antenna selector switch for the antennas;

a receiver;

a diversity processor configured to control the antenna selector switch; and a diagnostic processor including an output terminal connected to a control input of the diversity processor and providing, at its output terminal, a signal configured to prevent the diversity processor from performing further switching operations, and wherein the diagnostic processor further includes a comparing element, at which signals of antenna selector switching lines and output signals of a register are present, the output signals of the register indicating a number of the antenna to be set for diagnosis.

2. The circuit arrangement according to claim 1, wherein the diagnostic processor provides the signal that prevents further switching operations when the diversity processor has switched to a specific, preselectable antenna.

3. The circuit arrangement according to claim 2, wherein the diagnostic processor includes input terminals at which switching signals of the diversity processor for the antenna selector switch are present.

4. The circuit arrangement according to claim 2, wherein the receiver sends to the diagnostic processor a signal used to select a specific antenna.

5. The circuit arrangement according to claim 4, wherein a number of the selected antenna is enterable at the receiver.

6. The circuit arrangement according to claim 1, wherein the receiver is configured to transmit test signals along with a diagnosis enabling signal.

7. The circuit arrangement according to claim 6, wherein the test signal includes the number of the antenna.

8. The circuit arrangement according to claim 6, further comprising an IF cable configured to route the test signals, two diplexers arranged on a receiver side and a diagnostic processor side providing coupling in and coupling out.

9. A method for testing a radio receiving system including multiple antennas, an antenna selector switch for the antennas, a receiver and a diversity processor configured to control the antenna selector switch, comprising the steps of:

setting a frequency at which a relatively weak signal is received at the receiver;

selecting a specific antenna;

switching over the antennas by the diversity processor;

preventing the diversity processor from performing further switching operations as soon as the diversity processor has performed the switching over step;

displaying the switchover to the specific antenna; and testing a diversity switching threshold and an antenna function in accordance with known test signals.

10. The method according to claim 9, wherein the diversity processor is caused to perform the switching over step in accordance with one of an existing incoming signal fluctuation and a fluctuation produced by touching the antenna.

11. The method according to claim 9, wherein the testing step includes the substeps of testing directional characteristics of individual antennas by switching to the antenna to be tested, subsequently disconnecting an antenna cable from a receiver input and connecting the antenna cable to a measuring receiver.

12. The method according to claim 9, further comprising the steps of:

providing a demodulator with an IF signal generated by the receiver;

generating a level signal from the IF signal by the demodulator;

comparing a magnitude of the IF signal to a reverence signal to provide more precise evaluation of an antenna receiving level, the magnitude of the IF signal substantially proportional to the receiving level in a relevant range for diversity operation.

13. The method according to claim 9, wherein the receiver includes a test unit used as a control unit for a diagnostic processor.

14. A method for testing a radio receiving system including multiple antennas, an antenna selector switch for the antennas, a receiver and a diversity processor configured to control the antenna selector switch, comprising the steps of:

setting a frequency at which a relatively weak signal is received at the receiver;

selecting a specific antenna;

switching over the antennas by the diversity processor, wherein the switching over step includes the substep of switching over to a next antenna by briefly deactivating all of the antennas directly at the antenna selector switch at a concentration point of a switching diode;

preventing the diversity processor from performing further switching operations as soon as the diversity processor has performed the switching over step; and displaying the switchover to the specific antenna.

* * * * *

UNITED STATES PATENT AND TRADEMARK OFFICE
CERTIFICATE OF CORRECTION

PATENT NO. : 6,771,057 B1
DATED : August 3, 2004
INVENTOR(S) : Hans-Joachim Raddant It is certified that error appears in the above-identified patent and that said Letters Patent is hereby corrected as shown below:

Column 4,
Line 58, change "on,, the radio" to -- on the radio --

Column 6,
Line 6, change "function in accordance with known test signals." to -- function. --

Signed and Sealed this

Twenty-eighth Day of June, 2005

JON W. DUDAS
*Director of the United States Patent and Trademark Office*